United States Patent
Banerjee et al.

(10) Patent No.: US 12,469,748 B2
(45) Date of Patent: Nov. 11, 2025

(54) CMOS-COMPATIBLE GRAPHENE STRUCTURES, INTERCONNECTS AND FABRICATION METHODS

(71) Applicant: The Regents of the University of California, Oakland, CA (US)

(72) Inventors: Kaustav Banerjee, Goleta, CA (US); Junkai Jiang, Sunnyvale, CA (US); Kunjesh Agashiwala, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 387 days.

(21) Appl. No.: 18/252,459

(22) PCT Filed: Dec. 1, 2021

(86) PCT No.: PCT/US2021/061361
§ 371 (c)(1),
(2) Date: May 10, 2023

(87) PCT Pub. No.: WO2022/140026
PCT Pub. Date: Jun. 30, 2022

(65) Prior Publication Data
US 2024/0014071 A1    Jan. 11, 2024

Related U.S. Application Data

(60) Provisional application No. 63/123,587, filed on Dec. 10, 2020.

(51) Int. Cl.
*H01L 21/768* (2006.01)

(52) U.S. Cl.
CPC .. *H01L 21/76877* (2013.01); *H01L 21/76802* (2013.01); *H01L 21/76871* (2013.01)

(58) Field of Classification Search
CPC ......... H01L 21/76877; H01L 21/76802; H01L 21/76871; H01L 21/76805;
(Continued)

(56) References Cited

U.S. PATENT DOCUMENTS

| | | | | |
|---|---|---|---|---|
| 8,169,085 | B2 * | 5/2012 | Akimoto | H01L 23/5226 257/784 |
| 8,445,320 | B2 * | 5/2013 | Avouris | B82Y 10/00 438/105 |

(Continued)

FOREIGN PATENT DOCUMENTS

| | | |
|---|---|---|
| JP | 2012074682 A | 4/2012 |
| JP | 2018035010 A | 3/2018 |

(Continued)

OTHER PUBLICATIONS

Japanese Office Action from the corresponding Japanese Patent Application No. 2023-529992, dated Jan. 21, 2025.
(Continued)

*Primary Examiner* — Karen Kusumakar
(74) *Attorney, Agent, or Firm* — Greer, Burns & Crain, Ltd.; Steven P. Fallon (57) ABSTRACT

An MLG (multilayer graphene) device layer structure is connected with a via. The structure includes an M1 MLG interconnect device layer upon a dielectric layer. Interlayer dielectric isolates the M1 MLG interconnect device layer. An M2 MLG interconnect device layer is upon the interlayer dielectric. A metal via penetrates through the M2 MLG interconnect device layer, the interlayer dielectric and the M1 MLG interconnect device layer and makes edge contact throughout the thickness of both M1 MLG and M2 MLG layers. A method diffuses carbon from a solid phase graphene precursor through a catalyst layer to deposit MLG on
(Continued)

a dielectric or metal layer via application of mechanical pressure at a diffusion temperature to form MLG layers.

18 Claims, 6 Drawing Sheets

(58) Field of Classification Search
CPC ......... H01L 21/32051; H01L 21/76885; H01L 23/5226; H01L 23/53276; H01L 21/76895
See application file for complete search history.

(56) References Cited

U.S. PATENT DOCUMENTS

| | | | |
|---|---|---|---|
| 8,952,258 | B2 | 2/2015 | Plucinski et al. |
| 9,159,615 | B2 | 10/2015 | Saito et al. |
| 9,202,743 | B2 | 12/2015 | Bao et al. |
| 9,209,136 | B2 | 12/2015 | Barth |
| 9,257,391 | B2 | 2/2016 | Bao et al. |
| 9,761,532 | B2 | 9/2017 | Shin et al. |
| 10,079,209 | B2 | 9/2018 | Kondo et al. |
| 10,181,521 | B2 | 1/2019 | Venugopal et al. |
| 10,700,007 | B2 | 6/2020 | Jezewski et al. |
| 2007/0200179 | A1 | 8/2007 | Chen |
| 2015/0262940 | A1 | 9/2015 | Kitamura et al. |
| 2017/0133468 | A1 | 5/2017 | Colombo et al. |
| 2018/0350913 | A1 | 12/2018 | Yang et al. |
| 2020/0135655 | A1* | 4/2020 | Yang ................. H01L 21/76876 |

FOREIGN PATENT DOCUMENTS

| | | |
|---|---|---|
| WO | 2012039533 A1 | 3/2012 |
| WO | 2015145236 A1 | 10/2015 |

OTHER PUBLICATIONS

European Search Report from the corresponding European Patent Application No. 21911860.1, dated Oct. 31, 2024.
Korean Office Action from the corresponding Korean Patent Application No. 10-2023-7020796, dated Dec. 4, 2024.
Agashiwala, et al., "Demonstration of CMOS-Compatible Multi-Level Graphene Interconnects With Metal Vias", IEEE Transactions on Electron Devices, 2021, vol. 68, No. 4, pp. 2083-2091.
Ajayan, et al., "Two-dimensional van der Waals materials", Physics Today, 2016, vol. 69(9), pp. 39-44.
Banerjee, et al., "Global (Interconnect) Warming", Circuits & Devices, 2001, pp. 16-32.
Dutta, et al., "Sub-100 nm/\2 Cobalt Interconnects", IEEE Electron Device Letters, 2018, vol. 39, No. 5, pp. 731-734.
Hu, et al., "Future on-chip interconnect metallization and electromigration", IEEE International Reliability Physics Symposium (IRPS), 2018, pp. 4F.1-1-4F.1-6.
Jiang, et al., "All-Carbon Interconnect Scheme Integrating Graphene-Wires and Carbon-Nanotube-Vias", IEEE International Electron Devices Meeting (IEDM), 2017, pp. 14.3.1-14.3.4.
Jiang, et al., "Characterization of Self-Heating and Current-Carrying Capacity of Intercalation Doped Graphene-Nanoribbon Interconnects", IEEE International Reliability Physics Symposium (IRPS), 2017, pp. 6B-1.1-6B-1.6.
Jiang, et al., "CMOS-Compatible Doped-Multilayer-Graphene Interconnects for Next-Generation VLSI", IEEE International Electron Devices Meeting (IEDM), 2018, pp. 34.5.1-34.5.4.
Jiang, et al., "Intercalation Doped Multilayer-Graphene-Nanoribbons for Next-Generation Interconnects", Nano Lett., 2017, vol. 17, pp. 1482-1488.
Jiang, et al., "Ultimate Monolithic-3D Integration With 2D Materials: Rationale, Prospects, and Challenges", Journal of the Electron Devices Society, 2019, vol. 7, pp. 878-887.
Kang, et al., "On-chip intercalated-graphene inductors for next-generation radio frequency electronics", Nature Electronics, 2018, vol. 1, pp. 46-51.
Liu, et al., "Characterization of FeCl3 Intercalation Doped CVD Few-layer Graphene", IEEE Electron Device Letters, 2016, pp. 1-4.
Murali, et al., "Resistivity of Graphene Nanoribbon (GNR) Interconnects", IEEE Electron Device Letters, 2009, vol. 30, Vo. 6, pp. 611-613.
Xu, et al., "Modeling, Analysis, and Design of Graphene Nano-Ribbon Interconnects", 2009, IEEE Transactions on Electron Devices, vol. 56, No. 8, pp. 1567-1578.
Xu, et al., "Graphene Nano-Ribbon (GNR) Interconnects: A Genuine Contender or a Delusive Dream?", IEEE International Electron Devices Meeting, 2008, pp. 1-4.
Yeh, et al., "Area-Selective-CVD Technology Enabled Top-Gated and Scalable 2DHeterojunction Transistors with Dynamically Tunable Schottky Barrier", IEEE International Electron Devices Meeting (IEDM), 2019, pp. 23.4.1-23.4.4.
Yoon, et al., "Large Grain Ruthenium for Alternative Interconnects", 2019, IEEE Electron Device Letters, vol. 40, No. 1, pp. 91-94.
International Search Report from the corresponding International Patent Application No. PCT/US2021/061361, dated Jun. 30, 2022.
International Preliminary Report on Patentability from the corresponding International Patent Application No. PCT/US2021/061361, dated Jun. 13, 2023.
European Office Action from the corresponding European Patent Application No. 21911860.1, dated Jun. 26, 2025.
Chinese Office Action from the corresponding Chinese Patent Application No. 202180077379.4, dated Apr. 2, 2025.
Japanese Office Action from the corresponding Japanese Patent Application No. 2023-529992, dated Jul. 22, 2025.
Chinese Office Action from the corresponding Chinese Patent Application No. 202180077379.4, dated Aug. 1, 2025.

* cited by examiner

CMOS-COMPATIBLE GRAPHENE STRUCTURES, INTERCONNECTS AND FABRICATION METHODS

PRIORITY CLAIM AND REFERENCE TO RELATED APPLICATION

The application claims priority under 35 U.S.C. § 119 and all applicable statutes and treaties from prior U.S. provisional application Ser. No. 63/123,587 which was filed Dec. 10, 2020.

STATEMENT OF GOVERNMENT INTEREST

This invention was made with government support under contract No. W911NF-18-1-0366 awarded by the U.S. Army Research Office. The government has certain rights in the invention.

FIELD

A field of the invention is semiconductor devices and fabrication. The invention particular concerns interconnects and the formation of interconnects in integrated circuits (IC).

BACKGROUND

Interconnects are a crucial component in all ICs. Interconnects are conductive pathways that connect the multitude of transistors in digital, analog or radio-frequency (RF) ICs, and are a crucial factor determining their performance (speed), switching energy (power), and reliability (lifetime). The semiconductor industry currently employs Copper (Cu) as the main interconnect metal in most ICs including various microprocessors. However, with dimensional scaling, the resistivity of Cu increases significantly, due to "size-effects" (increased grain-boundary and surface scattering, and effect of any highly-resistive barrier layer that is hard to thin down) thereby increasing self-heating and degrading its current-carrying capacity (or reliability). K. Banerjee, et al., "Global (interconnect) warming," IEEE Circuits and Devices Magazine, vol. 17, no. 5, pp. 16-32, 2001. Therefore, the industry has been looking for a solution to replace Cu with another type of interconnect that scales with better performance attributes than Cu.

Cobalt (Co) has recently been introduced as a possible substitute for the narrowest Cu lines owing to its higher melting point than that of Cu. When wiring dimensions approach sub-20 nm, conventional (i.e., bulk or 3D) conductors such as Cu, Co, and noble metals, such as ruthenium (Ru), suffer from significant size effects, resulting in a nonlinear increase in resistivity, which increases RC-delay and self-heating (SH), degrades electromigration (EM) reliability, and thereby limits their performance, current-carrying capacity, and energy-efficiency.

Graphene, particularly multi-layer graphene (MLG) and doped-multilayer-graphene (DMLG), is a promising candidate material to replace Cu due to their reduced resistivity (for doped MLG) and significantly higher melting point than those of conventional metals including Cu and Co. Graphene belongs to the broader family of two-dimensional (2D) van der Waals materials. P Ajayan, P. Kim, K. Banerjee, "Two-dimensional van der Waals materials," Physics Today, 69, 9-38, 2016. Graphene is also an excellent barrier material to prevent the diffusion of Cu and other metals. Graphene can also be employed as seed layer for growing other electronic materials including Gallium Nitride (GaN) and to fabricate various material heterostructures including 2D-2D or 3D-2D structures for various micro/nano-electronic applications. However, back-end-of-line (BEOL) CMOS process compatibility is critical to adoption of any form of graphene (including monolayer (1L), few-layer graphene (FLG), MLG, and DMLG) for interconnects and other BEOL structures in CMOS integrated circuits, including barrier/capping layer for Cu (or other conventional metals) interconnects (K. Agashiwala, J. Jiang, K. Parto, D. Zhang, C. H. Yeh, K. Banerjee, "Demonstration of CMOS-compatible multi-level graphene interconnects with metal vias," IEEE Transactions on Electron Devices, vol. 68, no. 4, pp. 2083-2091, 2021), on-chip inductors (J. Kang, Y. Matsumoto, X. Li, J. Jiang, X. Xie, K. Kawamoto, M. Kenmoku, J. H. Chu, W. Liu, J. Mao, K. Ueno and K. Banerjee, "On-chip intercalated-graphene inductors for next-generation radio frequency electronics," Nature Electronics, 1 (1), 46-51, 2018), or for monolithic-3D integration (Jiang, K. Parto, W. Cao, and K. Banerjee, "Ultimate monolithic-3D integration with 2D materials: Rationale, prospects, and challenges," IEEE Journal of the Electron Devices Society, Vol. 7, pp. 878-887, 2019). Monolayer or FLG can also be used as canvass layer for fabricating low contact-resistance lateral heterojunction transistors (Graphene-2D-Semiconductor-Graphene) and other active devices in an area-selective manner. C-H. Yeh, W. Cao, A. Pal, K. Parto, and K. Banerjee, "Area-selective-CVD technology enabled top-gated and scalable 2D-heterojunction transistors with dynamically tunable schottky barrier," IEEE International Electron Devices Meeting (IEDM), San Francisco, Dec. 7-11, 2019, pp. 23.4.1-23.4. FLG can also be exploited to build highly transparent electrodes for solar cells and other optical devices. W. Liu, J. Kang and K. Banerjee, "Characterization of $FeCl_3$ intercalation doped CVD few-layer graphene," IEEE Electron Device Letters, Vol. 37, No. 9, pp. 1246-1249, September 2016. Prior efforts have sought to make graphene compatible for CMOS structures, but have various drawbacks that are discussed next.

Two prior publications disclose simulations that demonstrate that graphene nano-ribbons can outperform Cu interconnects by intercalation doping. The proposed methods for doping are not practical for CMOS fabrication, as the methods proposed relied upon impractical (toxic) $AsF_5$ doping. These publications are: Banerjee et al., "Graphene nano-ribbon (GNR) interconnects: A genuine contender or a delusive dream," IEDM Technical Digest, pp. 201-204, 2008; Banerjee et al., "Modeling, analysis and design of graphene nano-ribbon interconnects," IEEE TED, vol. 56, no. 8, pp. 1567-1578, 2009.

Another publication discloses doped graphene interconnects from transferred graphene by CVD growth at 900° C.-1100° C. The high temperature CVD and transfer are incompatible with state-of-the-art IC fabrication processes. This publication is Banerjee et al., "Intercalation doped multilayer-graphene-nanoribbons for next generation interconnects," Nano Letters, vol. 17, no. 3, pp. 1482-1488, 2017.

Others have proposed forming mechanical exfoliation to form graphene nanoribbon interconnects. Exfoliation is not suitable for large scale fabrication. In addition, the nanoribbons are not doped and therefore provide low conductivity that is not comparable to present Cu interconnects. This exfoliation is disclosed in Meindl et al., "Resistivity of graphene nanoribbon interconnects," IEEE Electron Device Letters, vol. 30, no. 6, pp. 611-613, 2009.

U.S. Pat. No. 8,952,258 discloses a winded graphene ribbon carried around an electrically conductive interconnect member. The carrier is a metal. This is a hybrid structure requiring a metal component and is unlikely to match Cu conductivity because conductance is limited by graphene to metal contact resistance. Current-carrying capacity of any such hybrid structures is also limited by the relatively low melting point of the metallic components.

U.S. Pat. No. 9,257,391 also discloses hybrid metal-graphene interconnect structures. The interconnects also required a barrier layer in a trench. The barrier material is selected from the group consisting of tantalum, tantalum nitride, and a graphene seed material selected from the group consisting of ruthenium, nickel, palladium, iridium, and copper. The same disadvantage discussed in the previous paragraph applies.

U.S. Pat. No. 9,159,615 discloses a graphene interconnect that requires an underlying catalyst film and an interconnection trench. Disclosed fabrication methods include a high temperature (>800° C.) graphene growth process that is not compatible with CMOS BEOL processes.

U.S. Pat. No. 9,120,743 discloses a graphene connector in a trench that is lined with a liner of Ru or Ta, along with fill metal being elemental forms or alloys including one or more of copper, aluminum, silver, gold, calcium, platinum, tin, lithium, zinc, nickel, and tungsten. The graphene formation process is low-temperature CVD, which is known to produce poor quality graphene.

U.S. Pat. No. 9,209,136 discloses hybrid metal/graphene interconnects. Graphene is formed over metal of copper (Cu), nickel (Ni), cobalt (Co), ruthenium (Ru), iridium (Ir), platinum (Pt), or palladium (Pd). High-temperature (incompatible with CMOS BEOL) is needed to grow the graphene on metal surfaces.

U.S. Pat. No. 9,761,532 also discloses hybrid metal-graphene interconnect structures. The hybrid structures include an interfacial bonding layer between the non-metallic material layer and the graphene layer, or the metal layer and the graphene layer. The disclosed process is a high temperature graphene growth process (>700° C.) that is limited to only few memory device applications. The same disadvantage discussed above regarding hybrid approaches applies.

U.S. Pat. No. 10,079,209 discloses a method for fabricating a graphene film. In the method, a catalyst metal film is formed on a substrate. The graphene film is formed on the catalyst metal film. The metal catalyst film is removed via an oxidizer. Then the graphene film is transferred to a substrate. Such a transfer process is not compatible with CMOS manufacturing and can increase film defect density and overall cost of manufacturing.

Jiang et al., CMOS-compatible doped-multilayer-graphene interconnects for next-generation VLSI," 2018 IEEE International Electron Devices Meeting (IEDM), describes a method for MLG graphene interconnects to be formed in a single device layer. The method diffuses carbon from a graphite powder through a Nickel catalyst layer. The paper does not disclose any techniques for multiple device layer formation or connections of MLG in different device layers to each other. Use of graphite powder makes the process difficult for integration in commercial CMOS manufacturing fabs where extremely small particle count is a critical need. Secondly, it is difficult to bring any powder inside a fully-automated commercial tool.

Figure 1:
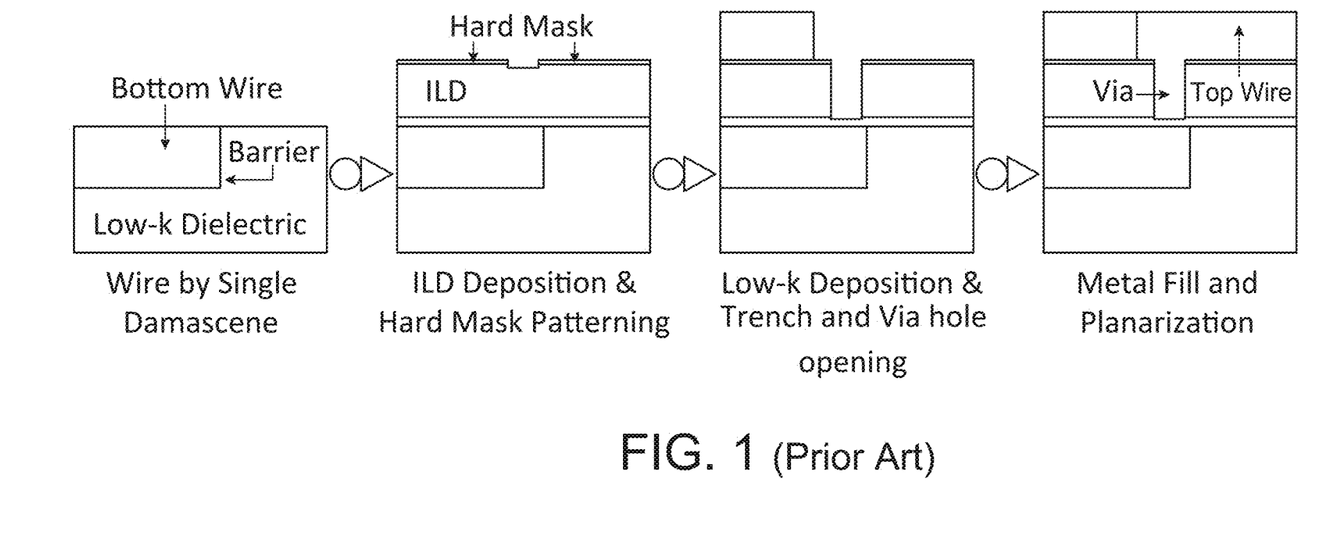
FIG. 1 (Prior Art) illustrates a dual damascene (DD) process for conventional metal wires as vias.
Figure 3A:
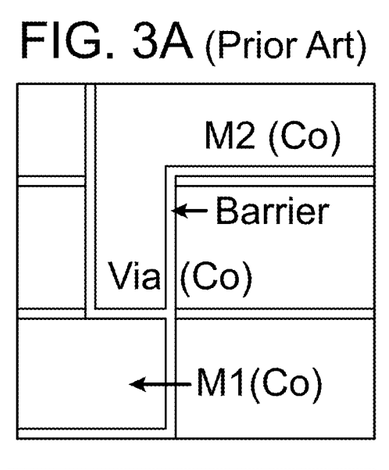
FIGS. 3A and 3B (Prior Art) illustrate the via layout and current density profile for a M1-via-M2 cross-section fabricated by the conventional dual damascene (DD) process.
Figure 3B:
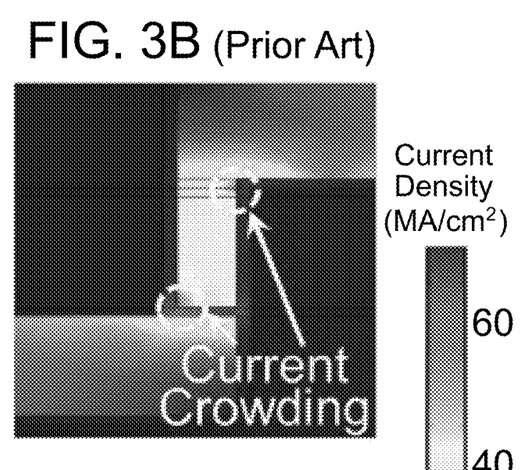

FIG. 1 illustrates a conventional dual damascene (DD) process for forming an metal(wire)-via-metal(wire) structure. The process has been scaled down to sub-20 nm wire widths. This structure suffers from the "size effects" discussed earlier, which increases self-heating (SH), degrades electromigration (EM) reliability and thereby limits interconnect current carrying capacity. FIGS. 3A and 3B show that with the via wire having its bottom contact an M1 layer and its top contact an M2 layer creates current crowding and SH effects, mainly due to the current re-distribution caused by the edge-contact resistance between via and the metal wire. Moreover, void formation during metal fill in highly scaled trenches and via holes during the DD process exacerbates the reliability and variability problems. It should be noted that the MLG wires cannot follow the DD process flow. As described in subsequent sections, one must use the subtractive etching (SE) process scheme for MLG wires.

Representative publications that have attempted to use graphene [1-3] and other materials [4-6] for single layer interconnects include the following: [1] J. Jiang, et al., "Intercalation doped multilayer-graphene-nanoribbons for next-generation interconnects," Nano Letters, 17(3), pp. 1482-1488, 2017; [2] J. Jiang, et al., "CMOS-compatible doped-multilayer-graphene interconnects for next-generation VLSI," IEEE IEDM, pp. 34.5.1-34.5.4, 2018; [3] J. Jiang, et al., "Characterization of self-heating and current-carrying capacity of intercalation doped graphene-nanoribbon interconnects," IEEE Int. Reliability Physics Symp. (IRPS), 2017, pp. 6-B.1-6-B.6; [4] C.-K. Hu, et al., "Future on-chip interconnect metallization and electromigration," IEEE Int. Reliability Physics Symp. (IRPS), pp. 4F.1.1-4F.1.4, 2018; [5] S. J. Yoon, et al., "Large grain ruthenium for alternative interconnects," IEEE Electron Device Letters, vol. 40, no. 1, pp. 91-94, 2019; [6] S. Dutta, et al., "Sub-100 $nm^2$ cobalt interconnects," IEEE Electron Device Letters, vol. 39, no. 5, pp. 731-734, 2018. These processes [4-6] have made marginal improvements in reducing the resistivity and enhancing the current carrying capacity, while a practical process for CMOS-compatible fabrication of multilayer MLG connected by via remains a need.

One publication discusses a multi-level MLG having a carbon nanotube (CNT) via. [8] J. Jiang, J. Kang, J. H. Chu and K. Banerjee, "All-carbon interconnect scheme integrating graphene-wires and carbon-nanotube-vias," IEEE International Electron Devices Meeting (IEDM), San Francisco, Dec. 2-6, 2017, pp. 14.3.1-14.3.4. Creating the carbon-nanotube-vias in this structure requires very high temperatures for the entire process that are not CMOS-compatible.

SUMMARY OF THE INVENTION

A preferred embodiment provides an MLG (multilayer graphene) device layer structure that is connected with a via. The structure includes an M1 MLG interconnect device layer upon a dielectric layer. Interlayer dielectric isolates the M1 MLG interconnect device layer. An M2 MLG interconnect device layer is upon the interlayer dielectric. A metal via penetrates through the M2 MLG interconnect device layer, the interlayer dielectric and the M1 MLG interconnect device layer and makes edge contact throughout the thickness of both M1 MLG and M2 MLG layers. A method diffuses carbon from a solid phase graphene precursor through a catalyst layer to grow MLG directly on a dielectric or metal layer via application of mechanical pressure at a diffusion temperature to form MLG layers

BRIEF DESCRIPTION OF THE DRAWINGS

FIGS. 2A-2D show a preferred method for forming MLG-metal wire via-MLG structures in a CMOS circuit fabrication using a subtractive etching process scheme;

DETAILED DESCRIPTION OF THE PREFERRED EMBODIMENTS

The invention provides multi-layer graphene (MLG) and doped-multilayer-graphene (DMG) structures, interconnects and fabrication methods to form the MLG and DMG structures interconnects. In a preferred embodiment method, MLG is directly grown on a dielectric ($SiO_2$) substrate at CMOS compatible temperatures (e.g., 350° C.) in a practical multi-tier configuration by a pressure-assisted solid-phase precursor synthesis method and connected using metal vias, in to achieve edge contact between the MLG and the wire via in a process that meets the thermal-budget requirements of all IC processed.

The invention provides a method of joining MLGs with an "edge-contact" configuration, which is the most preferred manner of connecting to the MLGs to minimize the interface contact resistance, and hence, the overall via resistance. This translates to faster speed for signal propagation and clock distribution in chips as well as much lower resistive losses (IR-drop) during on-chip power distribution.

In a preferred fabrication method, due to the absence of carbon diffusion through any metals or dielectrics, neither the wire (MLG or doped-MLG) nor the metal via require any diffusion-barrier layer, unlike Cu wires that must be completely encapsulated by highly resistive refractory metals that increase process complexity, cost, and the effective resistivity of Cu wires. A preferred growth technique currently shows a uniform large coverage of ~10 $mm^2$, which can be easily scaled up to 8 inch or 12-inch wafers/substrates. This shows the tremendous potential that this process scheme possesses for direct integration into the current CMOS process.

A preferred method can also be used (also demonstrated after some modifications) to grow MLG directly on metallic substrates such as Cu, which can be employed to explore the potential benefits of using MLG as a barrier/capping layer to Cu (and other metals), eliminating the need for high-refractory metals, which increase the effective resistivity of the Cu interconnects along with cost and process complexity.

A preferred multi-level MLG interconnect with metal via structure exhibits <2% conductivity degradation over 1000 hours at room temperature without any encapsulation or barrier layer, and negligible electromigration (EM) (a typical reliability issue in interconnects) under 200 $MA/cm^2$ of current density stress (~50-folds higher than what nanoscale Cu can safely sustain) at >100° C. This makes the present via scheme the most reliable process for contacting transistors among all the currently available materials and process schemes.

The significantly higher current-carrying capacity of the preferred multi-level MLG interconnect structure can allow for a significant reduction in the MLG thickness as compared to the conventional dual-damascene process scheme leading to lower intra-wire capacitances, which can significantly improve the speed, reduce noise-coupling, and lower switching energy or power consumption in ICs. This potential of MLG interconnects to lower power is particularly significant since up to $\frac{2}{3}^{rd}$ of the power consumption in modern microprocessors can be attributed to the interconnect capacitances. Preferred interconnect structures of the invention can enable faster, smaller, lighter, more flexible, more reliable, more energy-efficient, and more cost-effective ICs.

In a preferred method, MLG is directly grown on a dielectric ($SiO_2$) substrate at 350° C. in a multi-tier configuration by a pressure-assisted solid-phase diffusion and connected using metal vias, while meeting thermal-budget requirements of all IC processes.

Preferred methods join MLGs with an "edge-contact" configuration, which is the most preferred manner of connecting to the MLGs to minimize the interface contact resistance, and hence, the overall via resistance. This translates to faster speed for signal propagation and clock distribution in chips as well as much lower resistive losses (IR-drop) during on-chip power distribution.

Preferred methods avoid carbon diffusion through any metals or dielectrics, neither the wire (MLG or doped-MLG) nor the metal via require any diffusion-barrier layer, unlike Cu wires that must be completely encapsulated by highly resistive refractory metals that increase process complexity, cost, and the effective resistivity of Cu wires.

Preferred methods demonstrated in experiments a uniform large coverage of ~10 $mm^2$, which can be easily scaled up to 8 inch or 12-inch wafers/substrates. This demonstrates that methods can be directly integrated into the current state-of-the-art CMOS process.

A preferred method (as demonstrated experimentally) can grow MLG directly on metallic substrates such as Cu. One application of this method is to employ MLG as a capping layer to Cu, eliminating the need for high-refractory metals, which increase the effective resistivity of the Cu interconnects along with cost and process complexity.

A preferred device structure of a multi-level MLG interconnect with metal via scheme exhibits <2% conductivity degradation over 1000 hours at room temperature without any encapsulation or barrier layer, and negligible electromigration (EM) (a typical reliability issue in interconnects) under 200 $MA/cm^2$ of current density stress (~50-folds higher than what nanoscale Cu can safely sustain) at >100° C. Such a via structure greatly exceeds the most reliable current processes for contacting transistors among all the currently available materials and process schemes.

Preferred multi-level MLG interconnect via structures provide significantly higher current-carrying capacity compared to conventional structures, which can allow for a significant reduction in the MLG thickness as compared to the conventional dual-damascene process scheme leading to lower intra-wire capacitances, which can significantly improve the speed, reduce noise-coupling, and lower the power consumption in ICs. The present multi-level MLG interconnect via structures can lower power consumption, which is particularly significant since up to $\frac{2}{3}$rd of the power consumption in modern microprocessors can be attributed to the interconnect capacitances.

Preferred embodiments use different solid phase graphene precursors. One solid phase precursor is graphite powder. Another solid phase precursor is a graphite slurry. An additional solid phase graphite precursor is an amorphous carbon (a-carbon) layer. The method employing deposited a-carbon layer can provide significant advantages over the graphite powder and graphite slurry for high-volume CMOS manufacturing.

Experiments deposited MLG on $SiO_2$, which is a preferred and widely used dielectric. However, the present methods for forming MLG can form the MLG on any dielectric that can withstand the thermal requirements of the process (~350-400° C.).

Preferred embodiments of the invention will now be discussed with respect to experiments and drawings. Broader aspects of the invention will be understood by artisans in view of the general knowledge in the art and the description of the experiments that follows.

Figure 2A:
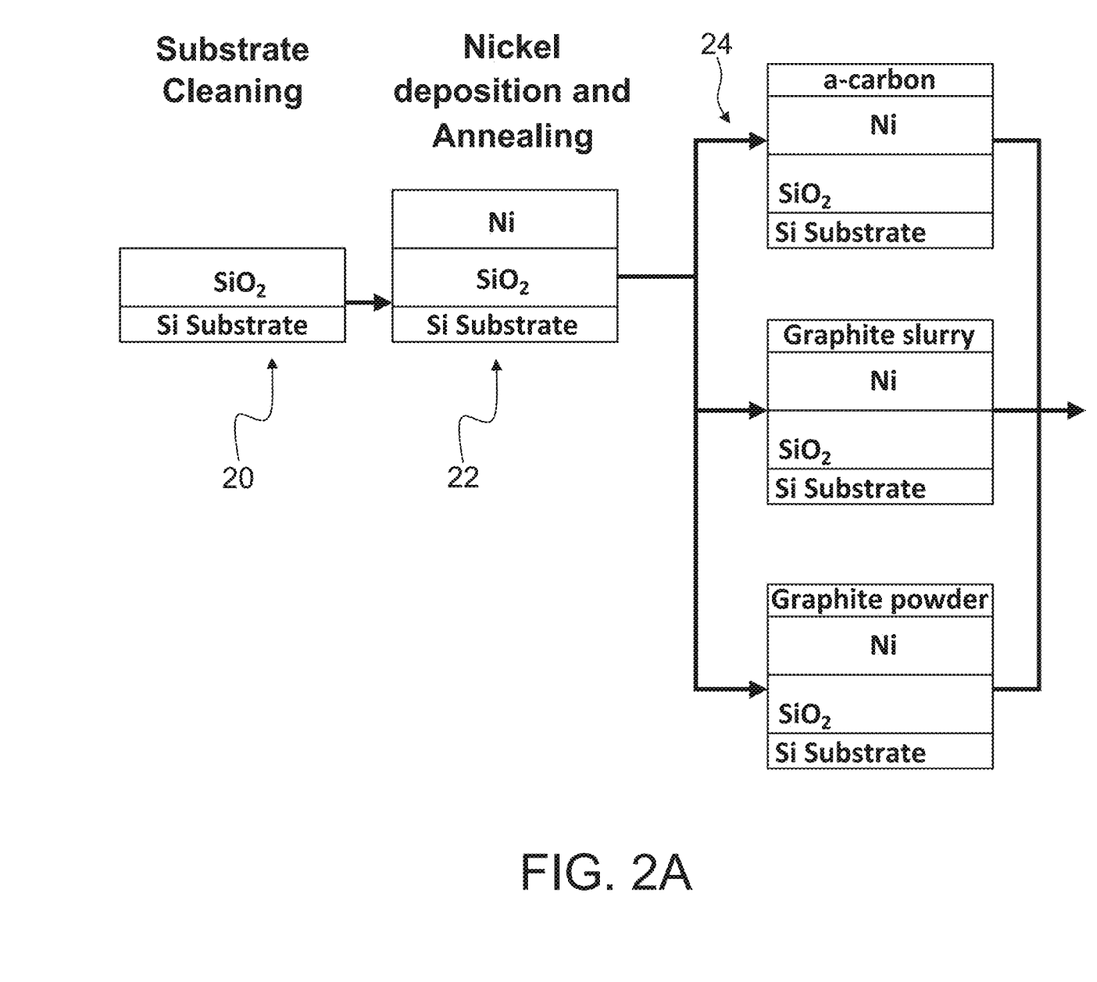
Figure 2B:
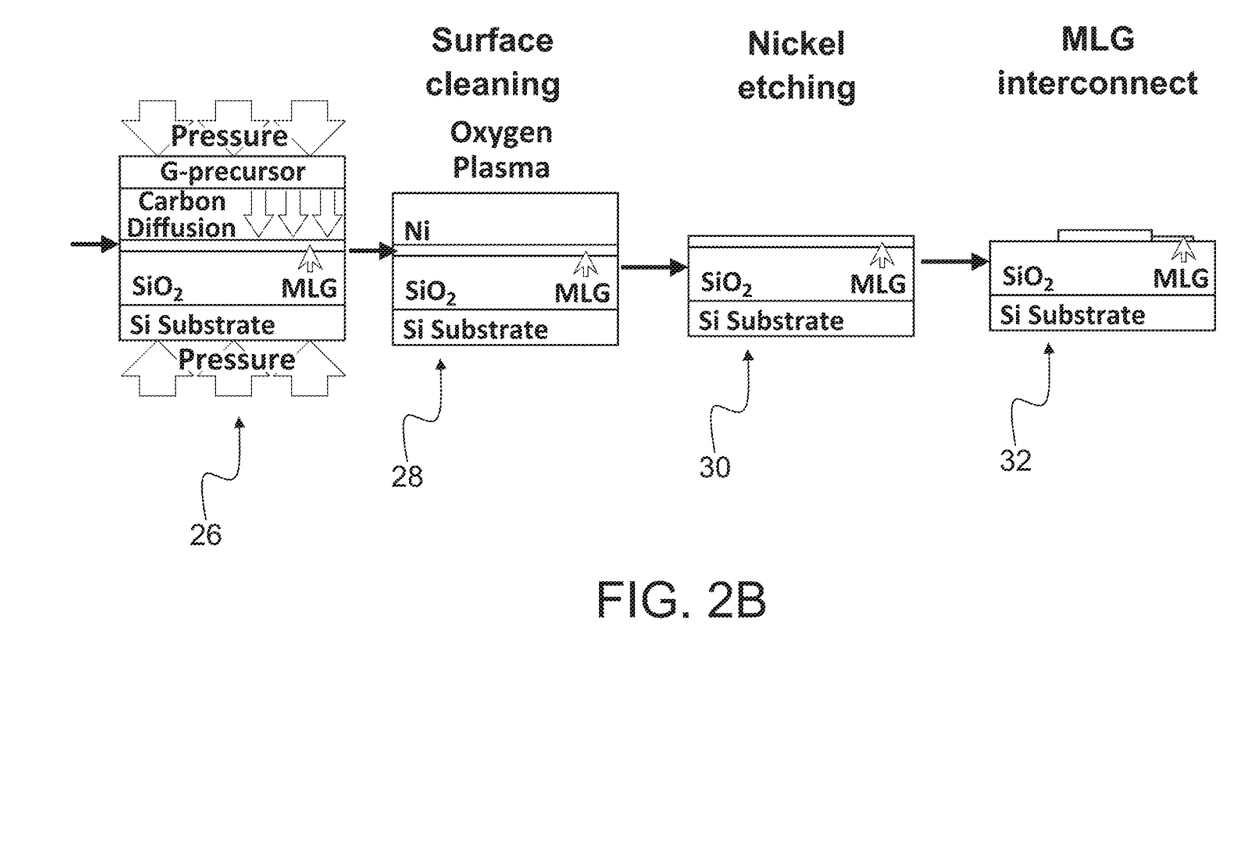
Figure 2C:
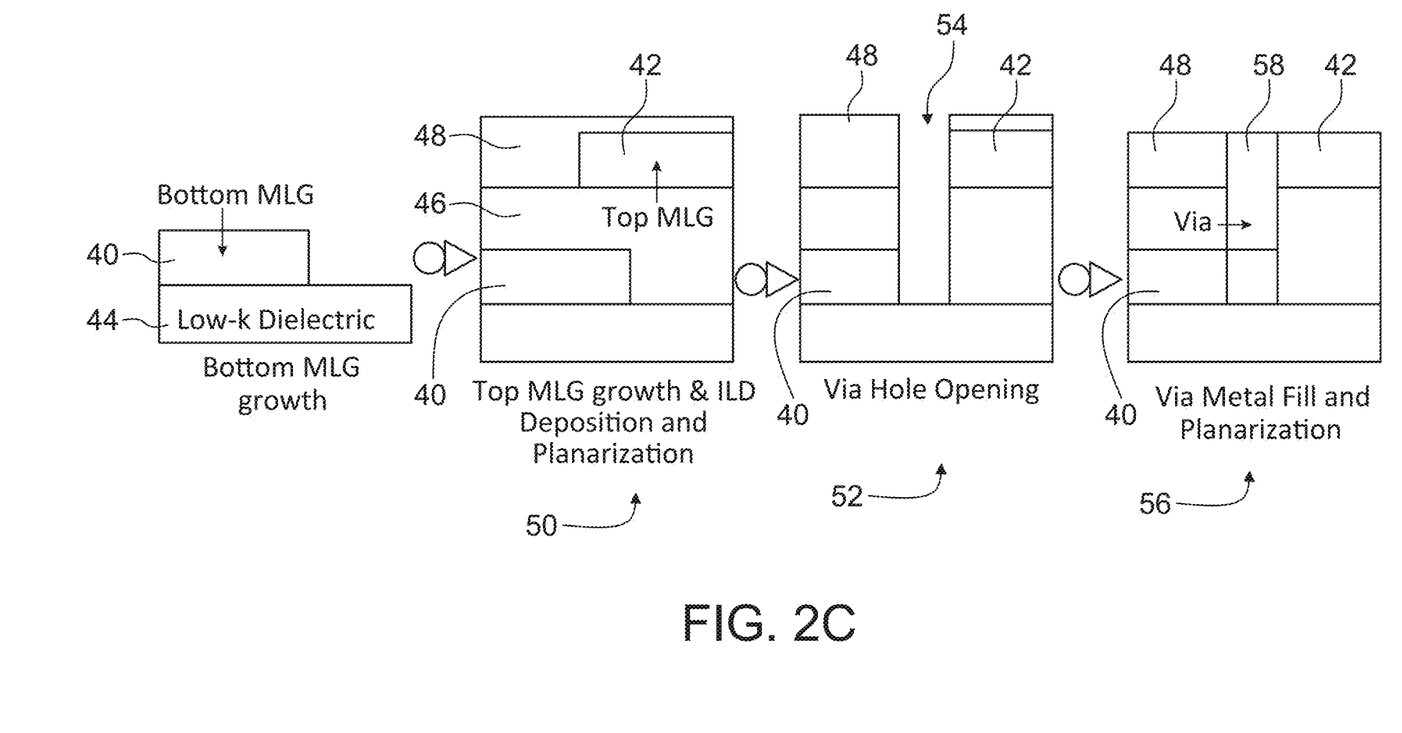

FIGS. 2A-2B illustrate a preferred method for graphene growth directly on dielectric at CMOS processing temperatures, and FIG. 2C illustrates a preferred method for formation of an MLG-via-MLG structure with edge contact between a metal via and two connected MLG layers. The process in FIGS. 2A-2B can reliably grow large-area, uniform, and good-quality MLG at multiple levels, and the process in FIGS. 2C-2D connects the multiple levels with an edge-contact metal via. The uniform MLG can be patterned into interconnect patterns via conventional masked etching techniques. For example, an experiment patterned MLG layers by oxygen ICP etching with a metal mask, which is subsequently removed by wet etching.

In FIG. 2A, a first step 20 cleans a silicon dioxide layer on a silicon substrate. The $SiO_2$, e.g., 200 nm will serve as the inter-layer dielectric in a MLG-via-MLG structure to be formed. In step 22, a metal or alloy catalyst is deposited, for example nickel. Other metals and alloys such as Co, Fe, Cu, Co—Ni alloy can also be utilized for growing graphene. However, the thickness, quality, area coverage of the resultant graphene is a critical function of the choice of the metal catalyst. Ni is the best possible and most preferred choice. In an experiment, 100 nm thick Ni was deposited via E-beam evaporation at a chamber pressure of around $3\times10^{-6}$ Torr. Thickness in the range of ~50 nm to ~200 nm can also be used. Generally, higher metal catalyst thicknesses decrease the thickness of the resultant MLG layer, and lower metal catalyst thicknesses increase the thickness of the resultant MLG layer (for the same growth time), as the carbon atoms need to diffuse through the grains and grains boundaries of the metal catalyst and nucleate at the $Ni/SiO_2$ interface. Low temperature annealing below 450° C., e.g. ~350° C. for 2 hours in a $H_2/Ar$ environment, improves the quality of the deposited metal catalyst (Ni). Annealing can be performed in vacuum, Ar, $H_2$, $N_2$, $O_2$, or forming gas, but a combination of $H_2/Ar$ is preferred because the presence of $H_2$ with an inert Ar background helps in significantly improving the metal quality (by increasing the metal grain size). Annealing just before the actual growth step significantly improved the coverage and the growth quality. Anneal is preferably conducted at the same temperature used for other steps to not only reduce the overall process complexity, but also to satisfy CMOS BEOL thermal budget requirements. A next step 24 deposits a solid-phase graphene precursor, and three options as shown in FIG. 2A, specifically an amorphous carbon option, a graphene slurry option and a graphene powder option. Powder can be sprinkled uniformly across the wafer, roughly around 100 μm thick. The amorphous carbon (~10-15 nm in thickness) was deposited in experiments via E-beam evaporation, which was the same technique used for depositing the Ni metal catalyst. In general, a relationship between the thickness of the amorphous carbon precursor to the thickness of the resultant MLG thin film is a function of the super saturation concentration of carbon in the selected catalyst. A 1:1 ratio between the amorphous carbon thin film thickness and the resultant MLG thickness provides a reasonable guide. A slurry is a solution of an organic solvent with graphite powder, which can be uniformly spread across the wafer and heated, so that the organic solvent can be evaporated. The resultant thin film is about ~10-20 nm thick.

The process continues in FIG. 2B step 26, with the formed graphene precursor being subject to pressure and temperature sufficient to causing carbon to diffuse through the Ni catalyst and form a graphene layer on the $SiO_2$. As an example, ~65-80 psi of mechanical pressure is applied at a temperature of at least about 350° C. for around ~60 mins to result in ~20 nm of multi-layer graphene (MLG). The mechanical pressure can be further increased for any graphene growth optimization. A minimum temperature for the diffusion can be as low as ~200° C. Maximum temps to accomplish diffusion could be as high as ~1000° C., However, CMOS-compatibility requires maximum temperatures below 500° C. Afterwards, oxygen cleaning in step 28 removes any excess graphene precursor and then the metal catalyst is etched away in step 30 to leave a high-quality graphene layer on the $SiO_2$. Subtractive etching is performed in step 32 to pattern an MLG interconnect.

The process in FIG. 2C can be used to produced bottom 40 and top 42 MLG (which can be referred to as M1 and M2) layers, which can also be patterned by conventional masked etching techniques. The M1 and M2 layers 40 and 42 are formed according to the FIGS. 2A-2B process directly on dielectric layers, e.g., $SiO_2$ layers 44 and 46. Plasma enhanced chemical vapor deposition (PECVD) was used in experiments for depositing $SiO_2$, but dielectric can be formed by any other technique. Dielectric with uniform coverage and thickness is typical, but methods of the invention are versatile enough to form MLG on arbitrary surface topologies. An additional dielectric layer 48 can form part of an interconnect pattern of the M2 MLG layer 42. In a step 50, the dielectric layer 46 is formed as an inter-dielectric layer and is prepared as in FIGS. 2A-2B for the formation of the top MLG M2 layer 42, after which additional dielectric 48 is formed. In step 52, a hole 54 is opened through the layers down to dielectric layer 44. In step 56, metal is deposited in the hole 54 to form via 58, which advantageously makes edge contact through the entire thickness of each of the bottom 40 and top 42 MLG M1 and M2 layers.

Various metals can be used for the via 58. Density functional theory (DFT) simulations conducted among Co, Ru, and W reveal that they possess almost identical edge-contact resistance to the MLG. However, the higher activation energy and lower resistivity of Co as compared to Ru and W. implies its higher tolerance to EM (Electromigration) and SH (Self-Heating), making it the better choice and preferred metal for the via 58 for a multi-level MLG wire-via structure.

Figure 3C:
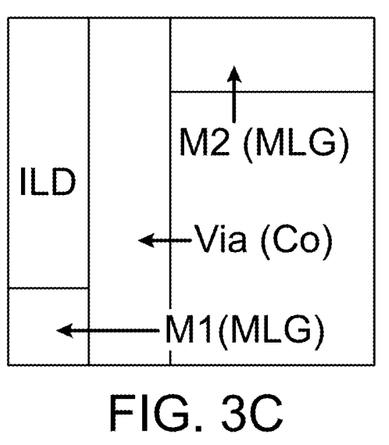
FIGS. 3C and 3D (Prior Art) illustrate the via layout and current density profile for a MLG-via-MLG cross-section fabricated by the preferred subtractive etching (SE) process.
Figure 3D:
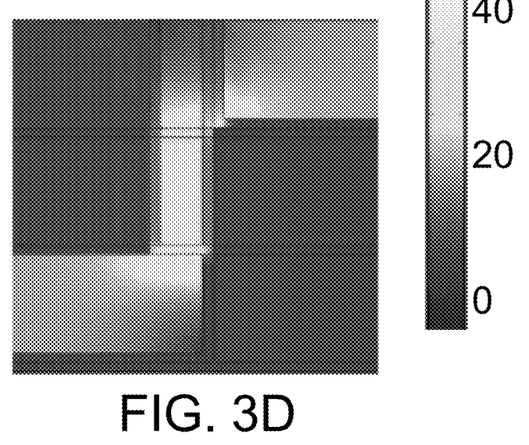

This edge contact avoids current crowding of top and bottom contact (FIGS. 3A and 3B), as shown in FIGS. 3C and 3D. The edge contact structure exhibits significant alleviation of current crowding and SH effects compared to the conventional DD process, mainly due to the current re-distribution caused by the edge-contact resistance between via and the MLG wire as shown in FIGS. 3B and 3D. MLG offers higher electrical conductivity and EM resistance compared with SE-Co and Ru, especially at smaller aspect ratios. Therefore, despite the addition of the edge-contact resistance between MLG and metal via increases the overall via resistance, testing shows that the FO4 delay remains invariant w.r.t the total via resistance.

The quality of MLG layers and via performance was tested experimentally. Sharp G and 2D peaks in the single point Raman spectrum data. TEM images verified uniform high-quality growth. Top MLG M2 42 fabricated over the inter-layer dielectric (ILD) 46 under exhibited comparable quality and thickness as the bottom MLG 40, as evidenced from the single point Raman spectra and the uniform large area Raman map observed experimentally. XPS was used to determine C1s content in the bottom MLG film, and showed exact peak position (1202.3 eV) and atomic composition (~83%) corresponding to the C=C sp2 bond that can also be observed in the conventional CVD grown MLG, which confirms the high-quality growth of the solid-phase MLG, without requiring the high and CMOS incompatible temperatures of >800° C. for CVD grown MLG.

An experimental fabrication consistent with FIGS. 2A-2C, demonstrated a two-level SE (Subtractive-Etching)-MLG interconnect structure using Co via where the via hole is etched through the wires and ILD using a single damascene process. The experimental structure included 20 nm thick MLG for both levels. Although unintentional, the use of $FeCl_3$ solution for removing Ni catalyst in step 30 provides surface-doping with presence of Fe at both the top and bottom MLG surfaces, which can lower the MLG resistivity. The via resistance was measured and the minimum contact resistance is estimated to be 137Ω-μm for 20-nm thick Co-MLG edge-contacts. This value also corroborates the partial surface doping claim of MLG caused by $FeCl_3$, as it lies between the theoretically estimated (by DFT) edge-contact resistance values of doped- and undoped-MLG with Co. Constant current stress tests showed that via increased resistance was <2% over >40 hrs, indicating negligible EM in the Co via and/or at the Co-MLG contacts.

Figure 4A:
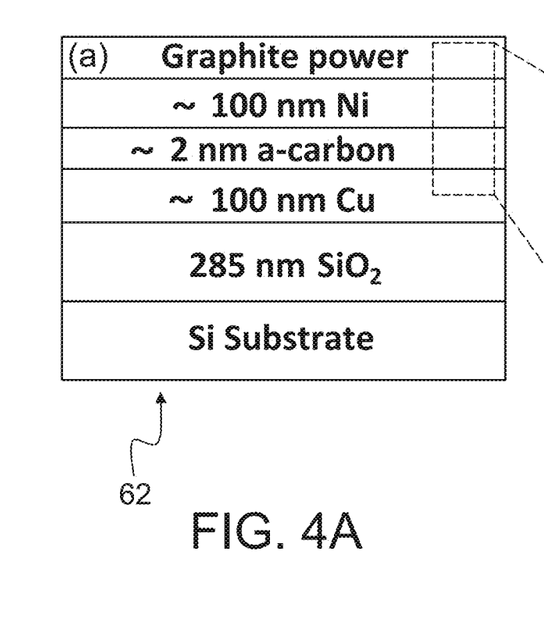
FIGS. 4A-B illustrate a present method for growth of MLG directly on metallic substrates (such as Cu).
Figure 4B:
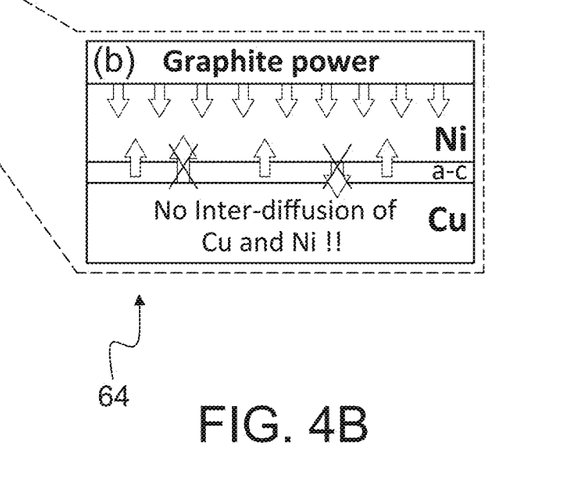

FIGS. 4A-4B show a preferred method for formation of MLG directly on a Cu layer. In step 60, a stack is formed that includes $SiO_2$ on a silicon substrate, followed by a Cu layer, a thin amorphous carbon barrier layer, a Nickel catalyst layer, and a solid phase graphene precursor, which can be graphite power, as shown, amorphous carbon or a graphite slurry as shown in FIG. 2A. The thin amorphous carbon layer prevents Cu and Ni layers from inter-diffusion and aids the graphene growth process by acting as an additional source of readily available carbon at the Cu interface and gets completely consumed during the MLG growth. Application of mechanical pressure in step 64 as in the manner of step 26 in FIG. 2B causes carbon to diffuse through the Ni catalyst and form a graphene layer on the Cu. After the graphene layer forms, cleaning of any remnant graphite or a-carbon on nickel and nickel etching are conducted as in steps 28 and 30 of FIG. 2B. Cleaning is conducted to remove any graphite formation on the Ni substrate using a $O_2$ plasma. Ni etching removed the Ni catalyst metal layer via wet etching using a $FeCl_3$ solution, but other material removal process can be used including dry etching. Subsequently, the MLG layer is etched via a subtractive process, such as a process using oxygen plasma forming MLG interconnects. The MLG can be doped using various methods to modulate the conductivity.

Experiments were also conducted to verify the method of FIGS. 4A-4B. In the experiments, a 300 nm $SiO_2$ layer was formed on Si wafer, on which 100 nm Cu, 2 nm amorphous carbon, and 100 nm Ni layers are deposited via E-beam deposition. The graphite precursor is then uniformly applied across the resultant stack, e.g. 100 μm of graphite powder. Raman spectra revealed the formation of the high-quality MLG grown directly on Cu at ~350° C., which was also verified by a layered structure visible in TEM images. Patterned interconnect MLG layers edge contacted with metal vias as discussed above were also formed in additional experiments. In an example experiment, bottom-MLG is grown as in FIGS. 2A-2B and then patterned by oxygen ICP etching with metal mask, which is subsequently removed by wet etching. 200 nm thick $SiO_2$ ILD is deposited after contacts and pads (15 nm Ni/150 nm Au) are defined to connect the bottom-MLG. The top-MLG is patterned to form an overlapping region with the bottom-MLG, followed by patterning of contacts and pads for the top-MLG. A via hole (widths ranging from 200 nm to 2 μm) is opened by three-steps of oxygen-, $CHF_3$—, and oxygen-ICP to etch the top-MLG, ILD, and bottom-MLG, respectively, with a photoresist mask. A ~220 nm thick Co is deposited by thermal evaporation (<100° C.) to fill the via hole at slow deposition rate to ensure full metal fill. Finally, ILD on top of bottom pads are etched to allow electrical contacts. The wire/via width can be scaled further with more advanced lithography techniques known in the art.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for forming MLG (multilayer graphene) device layers connected with a via at CMOS (complementary metal oxide semiconductor) compatible process temperatures directly onto dielectric or a metal layer, comprising:
   providing a dielectric or metal layer;
   depositing a metal or metal alloy catalyst layer on the dielectric or metal layer;
   depositing a solid phase graphene precursor on the catalyst layer; and
   diffusing carbon from the graphene precursor through the catalyst layer to deposit MLG on the dielectric or metal layer via application of diffusion pressure at a diffusion temperature to form an M1 MLG layer;
   removing the catalyst layer;
   depositing interlayer dielectric on the M1 MLG layer;
   forming an M2 MLG layer on the interlayer dielectric via the depositing a catalyst layer, depositing a solid phase graphene precursor and diffusing carbon;
   opening a via hole through the entirety of the M2 MLG, interlayer dielectric and M1 MLG layer to form a via hole; and
   depositing via metal in the via hole to make edge contact throughout the thickness of both M1 MLG and M2 MLG layers.

2. The method of claim 1, wherein the diffusion pressure is ~65-80 psi of pressure and the diffusion temperature is at least about 200° C.

3. The method of claim 1, wherein the graphene precursor is graphite powder.

4. The method of claim 1, wherein the graphene precursor is amorphous carbon.

5. The method of claim 1, wherein the graphene precursor is graphite slurry.

6. The method of claim 1, comprising annealing the catalyst at a temperature of less than 500° C. prior to depositing the solid phase graphene precursor.

7. The method of claim 1, wherein the via metal is one of Co, Ru, and W.

8. The method of claim 7, wherein the via metal is Co.

9. The method of claim 1, wherein the catalyst layer is Ni.

10. The method of claim 1, wherein the dielectric layer and the interlayer dielectric comprise $SiO_2$.

11. A method for forming MLG (multilayer graphene) on a metal surface, the method comprising:
- forming an amorphous carbon barrier layer on the metal surface;
- depositing a metal or metal alloy catalyst layer on the amorphous carbon barrier layer;
- depositing a solid phase graphene precursor on the catalyst layer; and
- diffusing carbon from the graphene precursor through the catalyst layer to deposit MLG on the metal surface via application of diffusion pressure at a diffusion temperature.

12. The method of claim 11, wherein the metal surface is Cu.

13. The method of claim 11, wherein the catalyst layer is Ni.

14. The method of claim 11, comprising patterning and doping the MLG.

15. An MLG (multilayer graphene) device layer structure connected with a via, comprising:
- an M1 MLG interconnect device layer upon a dielectric layer;
- interlayer dielectric isolating the M1 MLG interconnect device layer;
- an M2 MLG interconnect device layer upon the interlayer dielectric; and
- a metal via through the M2 MLG interconnect device layer, the interlayer dielectric and the M1 MLG interconnect device layer, the metal via making edge contact throughout the thickness of both M1 MLG and M2 MLG layers.

16. The device layer structure of claim 15, wherein the M1 MLG layer and the M2 MLG layer are patterned.

17. The device layer structure of claim 15, wherein the dielectric layer and the interlayer dielectric comprise $SiO_2$.

18. The device layer structure of claim 15, wherein the M1 MLG layer and the M2 MLG layer are doped.

* * * * *